US005764366A

United States Patent [19]
Nguyen et al.

[11] Patent Number: 5,764,366
[45] Date of Patent: Jun. 9, 1998

[54] METHOD AND APPARATUS FOR ALIGNMENT AND BONDING

[75] Inventors: Hung Ngoc Nguyen, Bensalem, Pa.; Laurence Shrapnell Watkins, Pennington, N.J.

[73] Assignee: Lucent Technologies Inc., Murray Hill, N.J.

[21] Appl. No.: 565,742

[22] Filed: Nov. 30, 1995

[51] Int. Cl.$^6$ ................................................ G01B 11/00
[52] U.S. Cl. ................................................ 356/401
[58] Field of Search ........................... 356/399–401; 250/548, 559.3; 355/53

[56] References Cited

U.S. PATENT DOCUMENTS

| | | | |
|---|---|---|---|
| 4,376,584 | 3/1983 | Hart et al. | 356/401 |
| 4,407,933 | 10/1983 | Fraser et al. | 430/296 |
| 4,614,433 | 9/1986 | Feldman et al. | 356/401 |
| 4,623,257 | 11/1986 | Feather | 356/401 |
| 4,755,053 | 7/1988 | Levinson et al. | 356/401 |
| 4,904,087 | 2/1990 | Harvey et al. | 356/400 |
| 4,992,394 | 2/1991 | Kostelak et al. | 437/229 |
| 5,152,055 | 10/1992 | L'Esperance, III et al. | 29/834 |
| 5,174,021 | 12/1992 | L'Esperance, III et al. | 29/840 |
| 5,194,948 | 3/1993 | L'Esperance, III et al. | 358/106 |
| 5,195,417 | 3/1993 | Hancock et al. | 356/401 |
| 5,383,118 | 1/1995 | Nguyen | 364/167.01 |

*Primary Examiner*—K. Hantis
*Attorney, Agent, or Firm*—Steven R. Bartholomew; Katharyn E. Olson

[57] ABSTRACT

A method and apparatus aligns device components based on an analysis of an image of features of the components to be aligned. The image is analyzed for deviation in component alignment, and a signal, based on the deviation, is sent to a positioning apparatus to adjust the position of the components relative to each other. The image of the components is advantageously a top view which permits measuring deviations in alignment of features on the top surfaces of components. The components are advantageously bonded together after alignment, and the alignment accuracy of the bonded components is checked.

30 Claims, 4 Drawing Sheets

METHOD AND APPARATUS FOR ALIGNMENT AND BONDING

TECHNICAL FIELD

The invention relates to the field of methods and equipment for aligning and bonding components in devices and to the field of devices produced by such methods and equipment.

BACKGROUND OF THE INVENTION

Packaging of devices, such as semiconductor, photonic and optoelectronics devices, typically requires that certain components in a device be aligned with certain other components in the device so that the components may be bonded, as for example by soldering, either to each other or to a common subassembly. Accurate alignment, within specified tolerance levels (often on the order of microns), is required so as to ensure proper operation of the device. For example, in photonic packaging, it is often required that a component, such as a laser, be aligned and bonded with respect to another component (e.g., a ball lens or optical fiber component) so as to properly focus and direct light emitted from the laser into the other component.

One method of alignment and bonding, commonly used in the packaging of such devices, is the die bonding technique. FIG. 1 illustrates a typical die bonding apparatus for aligning and bonding first component 105 and second component 109. First component 105 comprises laser 102 and submount 104. Laser 102 is positioned atop submount 104 so that submount 104 can provide mechanical rigidity for laser 102. Second component 109 comprises subassembly 108 and ball lens 106 which is mounted on subassembly 108. Subassembly 108 is advantageously held in place via vacuum tube 118 to heater 110. For reference purposes, the "top" and "bottom" of first component 105 and of second component 109 are defined with respect to coordinate system 190 in FIG. 1. Coordinate system 190 comprises three orthogonal axes, X, Y and Z as shown. Specifically, "top" surfaces of components have a Z value that is either consistently larger or smaller than the Z value of the "bottom" surface of the components. For example, for illustrative purposes herein, the "top" of a respective component has a larger Z value than the "bottom" of the respective component.

First component 105 is held by positioning apparatus 114 via vacuum tube 116. Laser 102 is inside cavity 130. The bottom surface of component 105 is marked with identification mark 121. The top of subassembly 108 of second component 109 is marked with identification mark 122. The components are considered to be aligned if identification marks 121 and 122 coincide (within specified tolerances) when positioning apparatus 114 lowers and places first component 105 onto subassembly 108.

Positioning apparatus 114 lowers first component 105 to meet second component 109. While the bottom surface of first component 105 and the top surface of subassembly 108 are sufficiently separated, apparatus 112, comprising mirror assembly 113, is inserted between the two surfaces. Apparatus 112 is supported by member 148. Mirror assembly 113 reflects an image of the position of the identification marks which image is reflected to camera 160 which produces an electronic image (e.,g. using charge coupled devices) which in turn is analyzed by vision system 125. Vision system 125 then sends signals to positioning apparatus controller 140 via signal path 150. Based on the signals, positioning apparatus controller 140 causes positioning apparatus 114 to adjust the position of first component 105 so that identification marks 121 and 122 will coincide when the bottom surface of first component 105 and top surface of second component 109 are joined. When joined, subassembly 108 is then advantageously bonded to first component 105 by activating heater 110 which heats subassembly 108 thereby causing solder or other bonding material on the top of subassembly 108 and/or on the bottom of first component 105 to melt. Heater 10 is eventually turned off and the bonding material is allowed to solidify thereby bonding first component 105 and second component 109.

FIG. 2 illustrates a top view of the components in FIG. 1. X-Y coordinate system 220 is provided as a reference. Axis 251 is also provided as a reference. Axis 251, termed the θ axis, is an axis perpendicular to the plane defined by the X and Y axes. The θ axis is an axis about which rotational adjustments between components are made. Lines 204 and 208 are shown for reference purposes. Correct alignment of laser 102 with ball lens 106 would cause line 204, extending along the X axis from the center of laser 102, to coincide with line 208 representing the diameter along the X axis of ball lens 106. The deviation in alignment (i.e., the distance between lines 204 and 208) is denoted ΔY. Similarly, correct alignment also requires that reference point 220 on the top of laser 102 be a specified distance, D, from reference point 240 on the circumference of ball lens 106. As shown in FIG. 2, the distance between laser 102 and ball lens 106 deviates from D by an amount ΔX. Finally, correct alignment requires that submount 104 be rotated about the θ axis so that edge 270 of submount 104 is parallel to edge 260 of subassembly 108. The deviation Δθ represents a rotational error in aligning components. Any situation in which Δθ, ΔX or ΔY are above respective tolerance levels is a misalignment of the components in the device which misalignment may cause degraded performance of the device.

FIGS. 1 and 2 illustrate that the die bonding technique has several drawbacks. First, the die bonding technique is not always sufficiently accurate. In particular, the mirror assembly must be removed when the first and second components are sufficiently close. With no information from mirror assembly 113, positioning apparatus 114 will receive no updated information on the position of identification marks 121 and 122 as the distance between the components diminishes. Thus, errors (such as those due to vibration of the positioning apparatus) introduced once the mirror assembly has been removed will not be corrected. Second, die bonding techniques are typically only sufficiently accurate for aligning and bonding the bottom surface of the first component and the top surface of the second component. However, it is often the case that a third component has previously been mounted on the first component, and it is the alignment of the third component to some feature on the second component that is critical. Thus, any previous errors that occurred in mounting the third component on the first will be compounded by errors introduced in aligning and bonding the first and second components. Moreover, it is often required that features on the top surface, as opposed to features on the bottom surface, of the first component be aligned with a feature on the top surface of the second component. Such a requirement renders the mirror assembly of standard die bonding equipment inadequate for such alignment requirements.

Thus, there is a need for improved equipment and techniques for aligning and bonding device components.

SUMMARY OF THE INVENTION

In accordance with the present invention a method and apparatus advantageously use images of features on the top surfaces of a first and second component to align the features. The method measures a deviation in alignment between a first feature on the top surface of the first component and a second feature on the top surface of the second component based on an image of the first and second features, wherein the first component is held by an apparatus adapted to receive and hold the first component, and the method generates a signal as a function of the deviation. The signal is used to affect the alignment between the two components. The inventive method may also be used for measuring a deviation in alignment between a first feature on a top surface of a first component and a second feature on a top surface of a second component, wherein the first and second components are bonded together, based on an image of the first and second features.

The apparatus comprises 1) a tool adapted for receiving and holding the first component so that the portion of the top surface of the first component comprising the first feature is detectable by an imaging system when the tool holds the first component and 2) the imaging system for generating an image of the first feature and of the second feature. The imaging system measures the deviation in alignment and generates a signal as a function of the deviation. The signal is advantageously used to control the positioning of the first component to the second component so as to reduce the deviation.

DETAILED DESCRIPTION

The drawings are not to scale, with certain dimensions being distorted to aid in clarity of explanation. For illustrative purposes, the invention will be described in the context of aligning and bonding components in an optoelectronic device. However, the invention is not limited to such a context.

Figure 1:
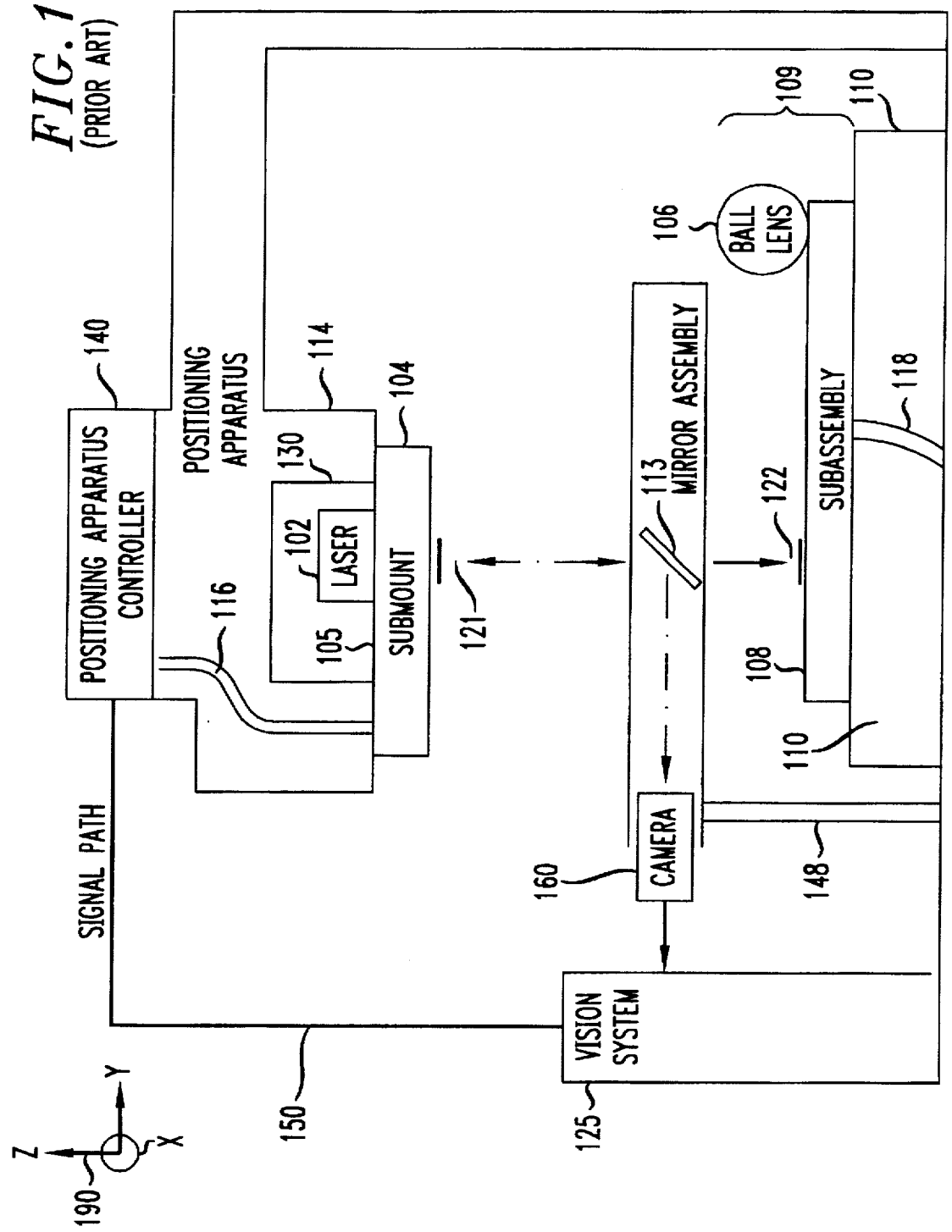
FIG. 1 illustrates a die bonding apparatus for bonding components.
Figure 3:
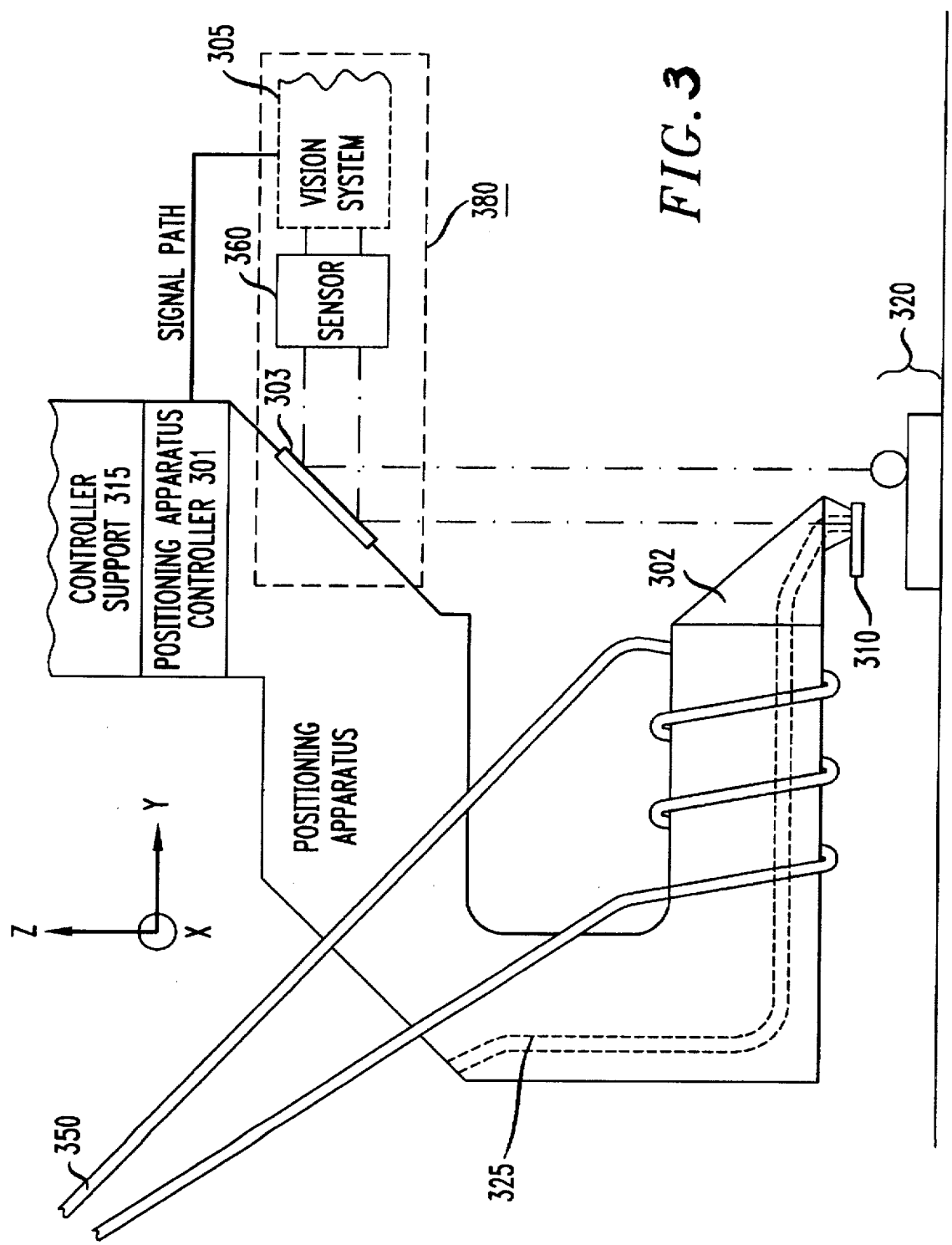
FIG. 3 illustrates side view of an embodiment of the inventive apparatus for aligning and bonding components.

FIG. 3 illustrates an embodiment of the inventive apparatus for aligning and bonding components. For illustrative purposes, the inventive apparatus will be illustrated in the context of bonding first component 310 to second component 320 where first component 310 is first component 105 of FIG. 1 comprising laser 102 and submount 104, and where second component 320 is second component 109 of FIG. 1 comprising subassembly 108 and ball lens 106. As in FIG. 1, coordinate system 390 is provided as a reference for identifying the top and bottom surfaces of the components.

Figure 2:
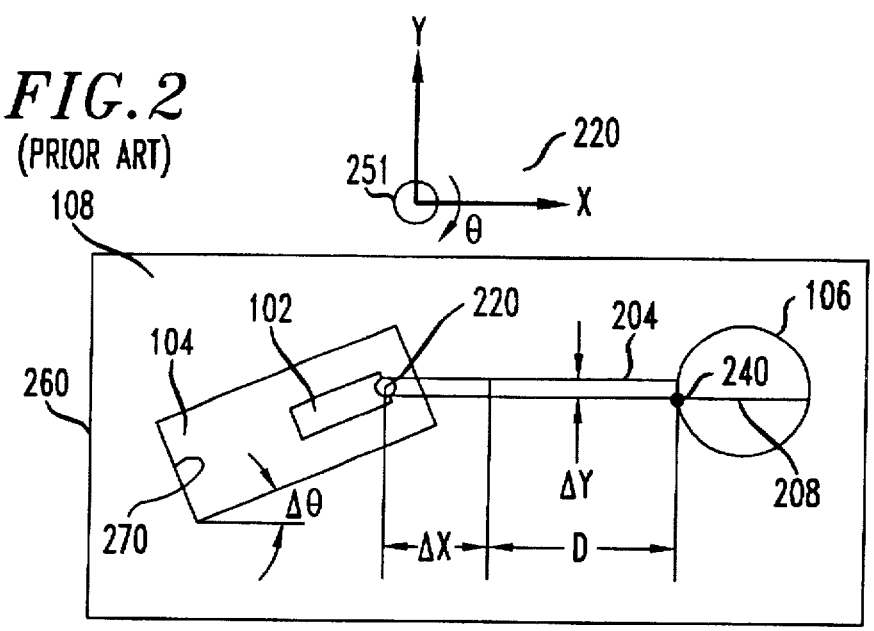
FIG. 2 illustrates a top view of the components in FIG. 1.

The inventive apparatus comprises two components: pickup tool 302 and imaging system 380 which, in this embodiment, comprises mirror 303, sensor 360 and vision system 305. Pickup tool 302 is advantageously attached to positioning apparatus 304 which is controlled by positioning apparatus controller 301 (supported by controller support 315). Imaging system 380 generates a image of, or detects, features on portions of the top surfaces of components 310 and 320. Based on the image, imaging system 380 determines an amount of misalignment or deviation in the X, Y and θ directions as shown in FIG. 2. Imaging system 380 then generates a signal based on the amount of misalignment or deviation (e.g., for use by positioning apparatus controller 301) so as to reduce the misalignment.

First component 105 is secured to pickup tool 302 by a vacuum in tube 325. Pickup tool 302 advantageously is adapted to hold and receive first component 310, as for example in opening area 404 (described below in conjunction with a discussion of FIG. 4A) so that the features to be aligned are not obscured, e.g. so that imaging system 380 can detect the features to be aligned or so that the features are visible to imaging system 380. Positioning apparatus controller 301 then controls positioning apparatus 304 and to pick up tool 302 so that first component 310 is located above second component 320. Positioning apparatus 304 and controller 301 may be robotic components such as those manufactured by New England Affiliated Technologies.

Figure 4A:
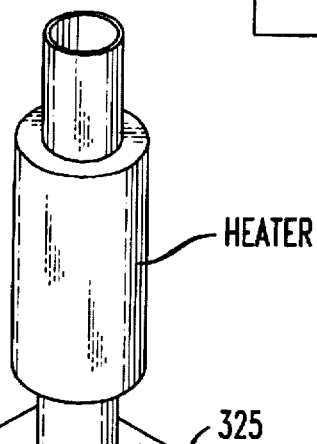
FIG. 4A is an angled view of a portion of the inventive apparatus.
Figure 4B:
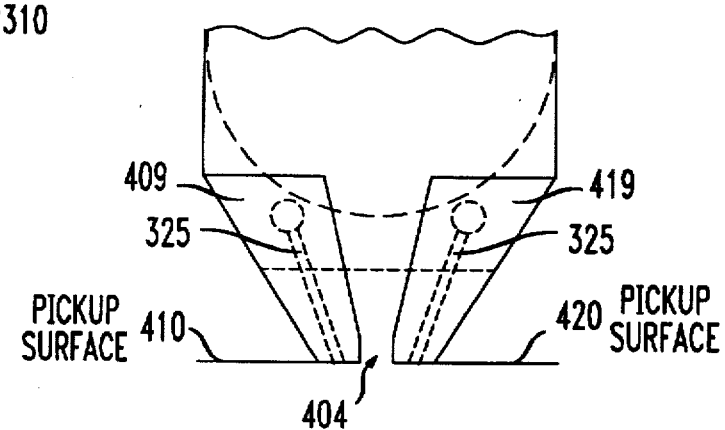
FIG. 4B is a top view of a portion of the inventive apparatus.

Pickup tool 302 is illustrated in greater detail in FIG. 4A which is angled view of pickup tool 302 illustrating opening area 404 through which features on the top surface of first component 310 are not obscured by pickup tool 302. Note, also, the heater on the tube 325. FIG. 4B is a top view of pickup tool 302 also illustrating opening area 404 and illustrating prongs 409 and 419 which terminate in pick up surfaces 410 and 420, respectively, which abut the top surface of component 310. Those skilled in the art will recognize that other configurations of pickup tool 302 are possible which configurations permit detection of features on the top surface of first component 310.

Figure 5:
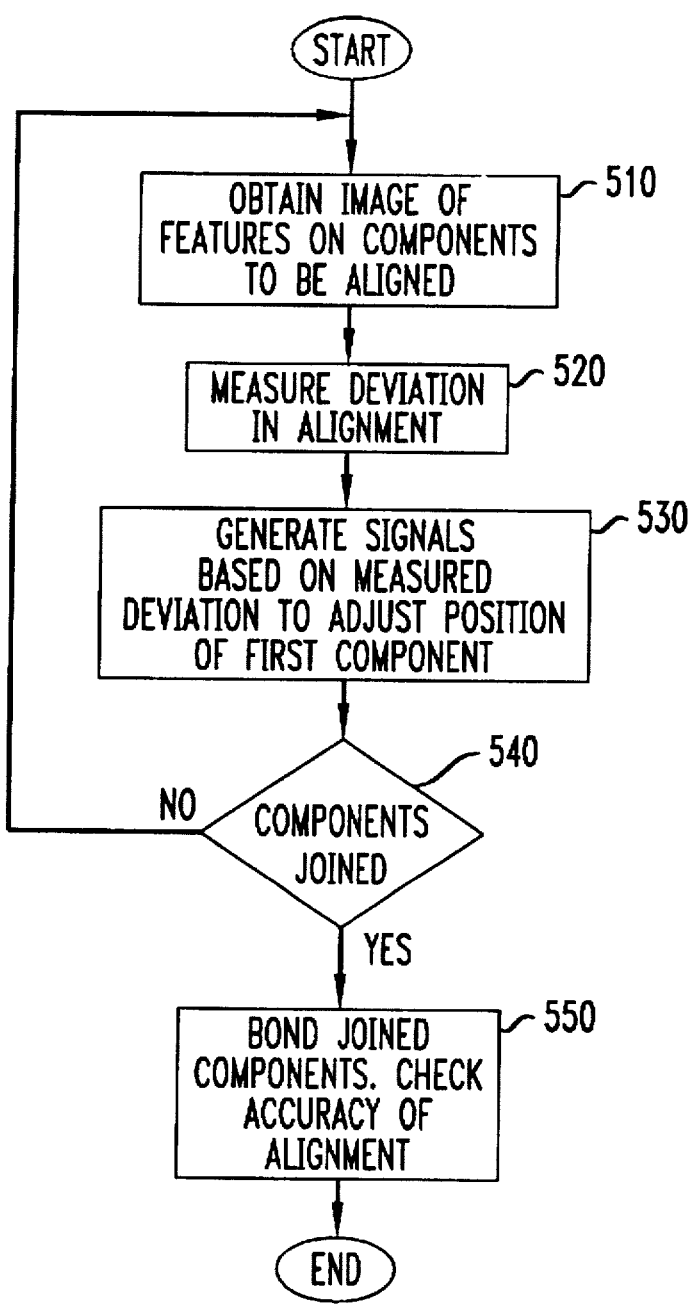
FIG. 5 is a flowchart of steps in the inventive method for aligning and bonding components.

Returning to FIG. 3, mirror 303 is advantageously positioned so as to reflect or redirect images obtained along the θ axis as shown. Mirror 303 reflects an optical image of features on a portion of the top surface of first component 310 and of features oil a portion of the top surface of second component 320 where the features on the components are to be aligned. The optical image of features on the position of first components 310 are advantageously those features in opening area 404 of pickup tool 302. The system of FIG. 3 executes the following steps, illustrated in FIG. 5, for aligning and bonding. In step 510 the optical image reflected by mirror 303 is first input to sensor 360. Sensor 360 converts the reflected image into an electronic image for use by vision system 305. Sensor 360 is, for example, a camera utilizing charge coupled device technology for generating an electronic representation or image based on an optical image. Vision system 305 advantageously is a system such as the Cognex Vision System Model 3400. The image is similar to the image of FIG. 2. Next in step 520, vision system 305 determines or measures the deviation in alignment in the X, Y and θ directions based on an analysis of the electronic image. In the case of illustrative embodiment, the electronic image of features of first component 310 and second component 320 are analyzed by vision system 305 to determine misalignment between ball lens 106 and laser 102. In step 530 signals are generated (based on the measured deviation) which are sent to position apparatus controller 301 via signal path 370. In response to the signals, positioning apparatus controller 301 controls or moves positioning apparatus 304 (and hence pickup tool 302), so as to better align features on the top surface of first component 310 with features on the surface of second component 320. Steps 510-530 may be repeated as first component 310 is lowered by positioning apparatus 304 so to touch second component 320.

Once first component 310 and second component 320 are joined (as determined in step 540) heater 350 may advantageously be activated to bond the components together in step 550. Heater 350 causes bonding material, e.g., solder, on the bottom surface of first component 310 and/or on the top surface of second component to melt and to solidify when the heat is deactivated. Note that the inventive apparatus advantageously views images of portions of the top surfaces of both first component 310 and second component 320 so as to further allow observation of the behavior of the bonding process, thereby allowing detection of imperfect bonds. Further, note that the inventive apparatus may be used to check or measure the accuracy of the alignment after bonding by repeating steps 510 and 520 and outputting the measured deviation.

In another embodiment of the invention, imaging system 380 comprises sensor 360 and vision system 305 only. In this embodiment, mirror 303 is eliminated by attaching sensor 360 to positioning apparatus 304 so as to position sensor 360 to view along the θ axis.

Although the inventive method and apparatus have been illustrated in the context of alignment of and bonding of components in optoelectronic devices, those skilled in the are will recognize the applicability of these teachings to other contexts, such as the fabrication of semiconductor devices. For example, the inventive method and apparatus may be used with components of sizes larger than the size of components typically used in the optoelectronics industry. Further, the inventive method may be used to align more than two components as for example by placing a component between two other components. Moreover, the accuracy of the inventive method and apparatus is typically limited only by the wavelength of the radiation used to generate the image of the features on the top surfaces of the components to be aligned and by the "step size" or minimum distance increment of the positioning apparatus.

What is claimed is:

1. A method for heat-bonding a first component to a second component, the method comprising the steps of:
   measuring a deviation in alignment between a first feature on a top surface of the first component and a second feature on a top surface of the second component based on an image of said first and second features, wherein said first component is held by a bonding tool configured to receive and hold said first component upon the application of a vacuum between said first component and said bonding tool, and
   generating a signal as a function of said deviation to affect the alignment between said first feature and said second feature.

2. The method of claim 1 wherein said image is an electronic image generated based on an optical image.

3. The method of claim 2 wherein said optical image is reflected by a mirror.

4. The method of claim 1 further comprising the step of:
   adjusting the position of said first component relative to said second component based on said signal.

5. The method of claim 1 wherein the measured deviation comprises deviation measurements in a plane substantially parallel to said top surface of said first component.

6. The method of claim 5 wherein the measured deviation comprises a deviation measurement about an axis perpendicular to said plane.

7. The method of claim 1 further comprising the step of: using heat to bond together said first and second components.

8. The method of claim 7 further comprising the step of: based on an image of said first and second features on the bonded together first and second components, measuring a deviation in alignment between said first feature on said top surface of said first component and said second feature on said top surface of said second component.

9. A product comprising a first component thermally bonded to a second component, said product produced by the process of:
   measuring a deviation in an alignment between a first feature on a top surface of said first component and a second feature on a top surface of said second component, wherein the process of measuring is based on an image of said first and second features, wherein said first component is held by a bonding tool configured to receive and hold said first component upon the application of a vacuum between the first component and the bonding tool,
   generating a signal as a function of said deviation,
   adjusting the position of said first component relative to said second component based on said signal, and
   bonding together said first and second components using heat.

10. The method of claim 9 wherein said image is an electronic image generated based on an optical image.

11. The method of claim 10 wherein said optical image is reflected by a mirror.

12. A system comprising:
    a heat bonding tool configured to hold and receive a first component, said first component comprising a first feature on a top surface of said first component, wherein said first feature is detectable by an imaging system when said tool holds said first component, wherein said first feature is to be aligned with a second feature on a top surface of a second component,
    said imaging system for generating an image of said first feature and of said second feature.

13. The system of claim 12 wherein said imaging system measures a deviation in alignment between said first feature on said top surface of said first component and said second feature on said top surface of said second component based on said image.

14. The system of claim 13 wherein said imaging system generates a signal as a function of said deviation.

15. The system of claim 12 further comprising:
    positioning apparatus controller for positioning said first component relative to said second component based on said signal.

16. The system of claim 12 further comprising:
    heating means for bonding together said first and second components.

17. The system of claim 12 wherein said imaging system comprises:
    a sensor for generating an electronic image based on an optical image, and
    a vision system for analyzing said electronic image.

18. The system of claim 12 wherein said imaging system further comprises a mirror wherein said mirror reflects an optical image to said sensor.

19. A method comprising the steps of:
    measuring a deviation in an alignment between a first feature on a top surface of a first component and a second feature on a top surface of a second component, wherein said first and second components are bonded together using heat, based upon an image of said first and second features, and
    generating a signal as a function of said deviation to affect the alignment between said first feature and said second feature.

20. The method of claim 19 wherein said image is an electronic image generated based on an optical image.

21. The method of claim 20 wherein said optical image is reflected by a mirror.

22. The method of claim 19 wherein the measured deviation comprises deviation measurements in a plane substantially parallel to said top surface of said first component.

23. The method of claim 22 wherein the measured deviation comprises a deviation measurement about an axis perpendicular to said plane.

24. A method of fabricating a device, wherein said device comprises a first component and a second component to be bonded together using heat, said method comprising the steps of:

measuring a deviation in alignment between a first feature on a top surface of said first component and a second feature on a top surface of said second component based upon an image of said first and second features, wherein said first component is held by a bonding tool configured to receive and hold said first component upon the application of a vacuum between the bonding tool and the first component, and generating a signal as a function of said deviation to affect the alignment between said first feature and said second feature.

25. The method of claim 24 wherein said image is an electronic image generated based on an optical image.

26. The method of claim 25 wherein said optical image is reflected by a mirror.

27. The method of claim 24 further comprising the step of:

adjusting the position of said first component relative to said second component based on said signal.

28. The method of claim 24 wherein the measured deviation comprises deviation measurements in a plane substantially parallel to said top surface of said first component.

29. The method of claim 28 wherein the measured deviation comprises a deviation measurement about an axis perpendicular to said plane.

30. The method of claim 20 further comprising the step of:

based on an image of said first and second features on the bonded together first and second components, measuring a deviation in alignment between said first feature on said top surface of said first component and said second feature on said top surface of said second component.

* * * * *